United States Patent
Luo et al.

(10) Patent No.: US 11,355,473 B2
(45) Date of Patent: Jun. 7, 2022

(54) TILED LIGHT EMITTING DIODE DISPLAY PANEL HAVING DIFFERENT RESISTANCE PER UNIT LENGTH SIGNAL LINES

(71) Applicant: a.u. Vista, Inc., Irvine, CA (US)

(72) Inventors: Fang-Chen Luo, Irvine, CA (US);
Chan-Jui Liu, Hsinchu (TW);
Chun-Cheng Cheng, Hsinchu (TW);
Shih-Hsing Hung, Hsinchu (TW)

(73) Assignee: A.U. VISTA, INC., Irvine, CA (US)

( * ) Notice: Subject to any disclaimer, the term of this patent is extended or adjusted under 35 U.S.C. 154(b) by 38 days.

(21) Appl. No.: 16/902,639

(22) Filed: Jun. 16, 2020

(65) Prior Publication Data
US 2021/0391312 A1    Dec. 16, 2021

(51) Int. Cl.
| | |
|---|---|
| *H01L 23/00* | (2006.01) |
| *H01L 25/16* | (2006.01) |
| *H01L 25/18* | (2006.01) |
| *G09G 3/32* | (2016.01) |
| *G09G 3/3225* | (2016.01) |
| *H01L 27/32* | (2006.01) |
| *H01L 27/15* | (2006.01) |

(52) U.S. Cl.
CPC .............. *H01L 24/83* (2013.01); *G09G 3/32* (2013.01); *G09G 3/3225* (2013.01); *H01L 24/32* (2013.01); *H01L 24/33* (2013.01); *H01L 25/167* (2013.01); *H01L 25/18* (2013.01); *G09G 2300/0426* (2013.01); *H01L 27/156* (2013.01); *H01L 27/3244* (2013.01); *H01L 2224/32235* (2013.01); *H01L 2224/33517* (2013.01); *H01L 2224/83125* (2013.01); *H01L 2224/83815* (2013.01); *H01L 2924/30101* (2013.01)

(58) Field of Classification Search
CPC ........................................................ H01L 24/83
USPC .................................................... 345/1.3
See application file for complete search history.

(56) References Cited

U.S. PATENT DOCUMENTS

| | | |
|---|---|---|
| 5,472,889 A | 12/1995 | Kim et al. |
| 2017/0025593 A1* | 1/2017 | Bower ................... H01L 33/64 |
| 2019/0027534 A1* | 1/2019 | Rotzoll ............... H01L 25/0753 |
| 2019/0191574 A1* | 6/2019 | Kim ...................... F16B 5/0664 |

FOREIGN PATENT DOCUMENTS

| | | |
|---|---|---|
| CN | 108470526 A | 8/2018 |
| WO | 2018220683 A1 | 12/2018 |

* cited by examiner

*Primary Examiner* — Long D Pham
(74) *Attorney, Agent, or Firm* — Tim Tingkang Xia, Esq.; Locke Lord LLP

(57) ABSTRACT

A tiled light emitting diode (LED) display panel includes multiple flexible back plates arranged in tiles. Each flexible back plate has multiple through holes formed thereon. A pixel array is formed by multiple LEDs on the flexible back plates and collectively defines multiple pixels. Each pixel includes one LED and thin-film transistor (TFT) circuits disposed on a first side of a corresponding flexible back plate. A printed circuit board (PCB) is disposed at a second side of the flexible back plates. A third side of the PCB faces the second side of the flexible back plates and has multiple signal lines formed thereon. The LEDs and the TFT circuits of the pixels are electrically connected to the corresponding signal lines via multiple conductive structures formed in the through holes. A resistance per unit length of each flexible back plates is greater than a resistance per unit length of the PCB.

20 Claims, 19 Drawing Sheets

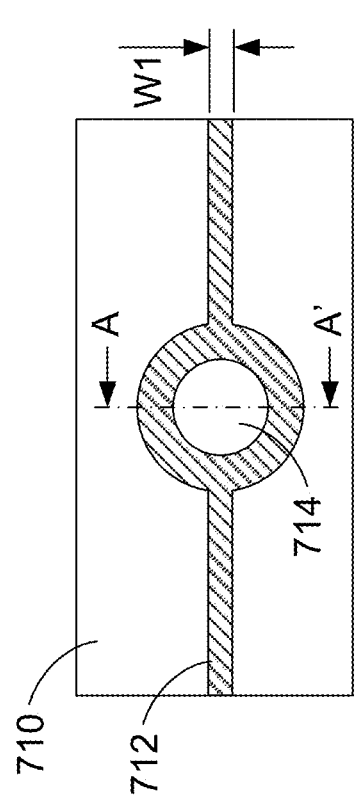
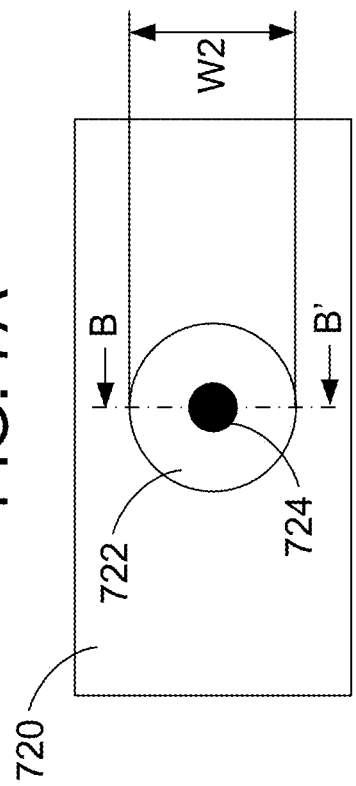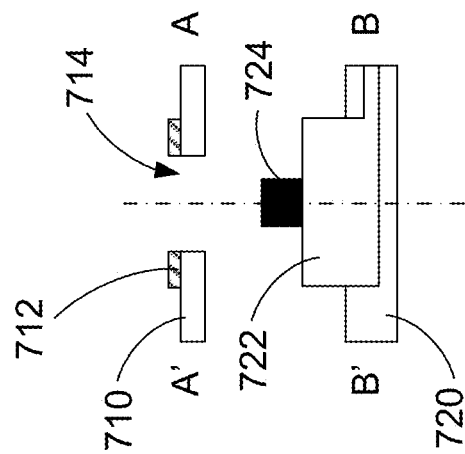
FIG. 7A
FIG. 7B
FIG. 7C

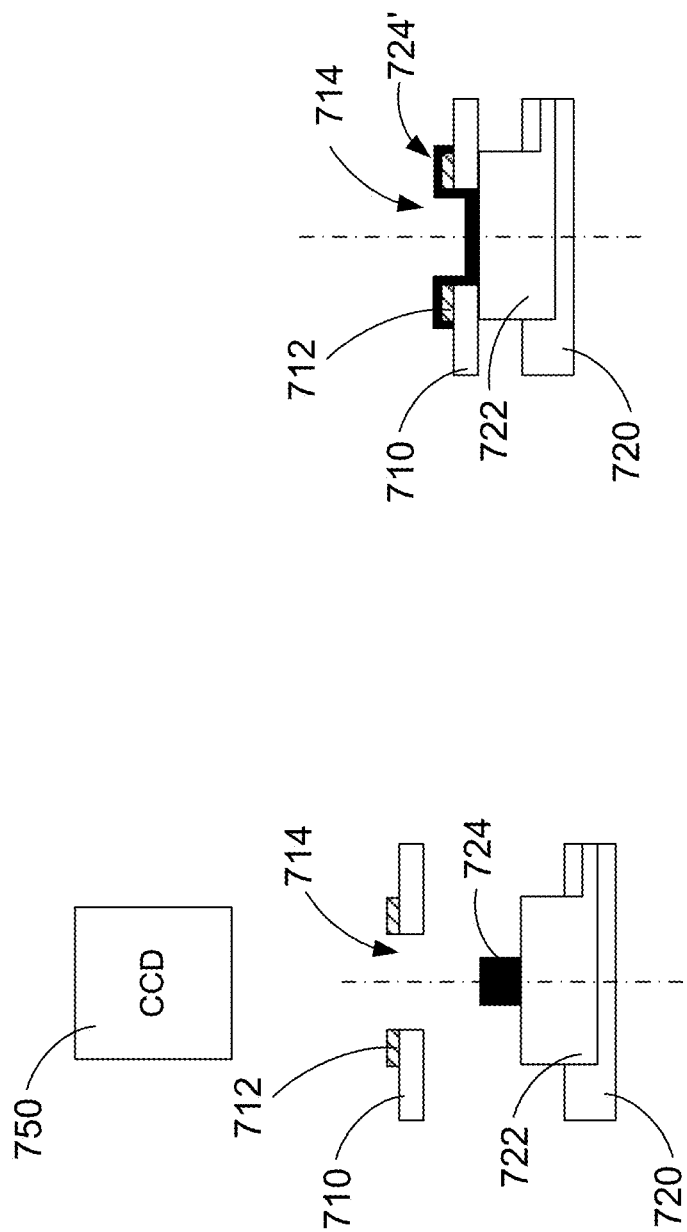

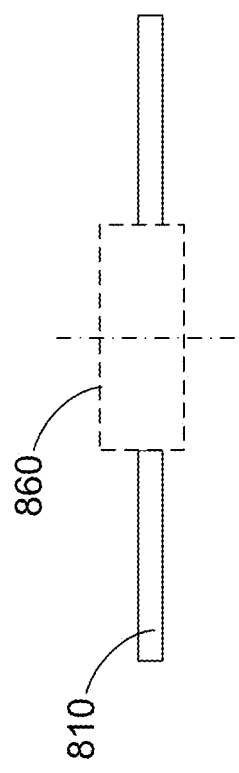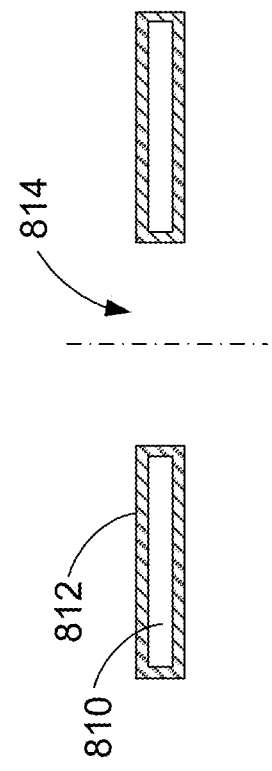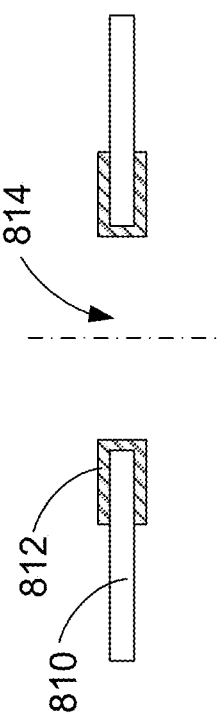

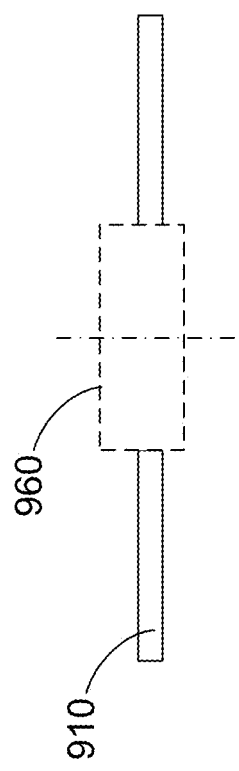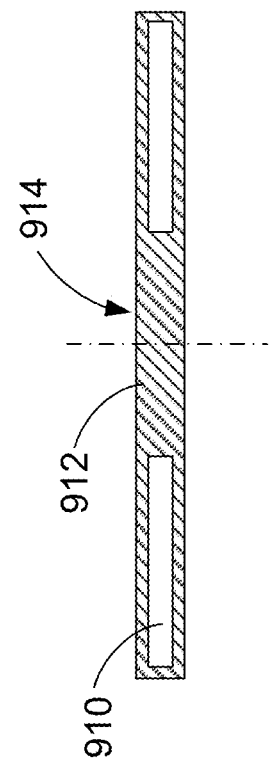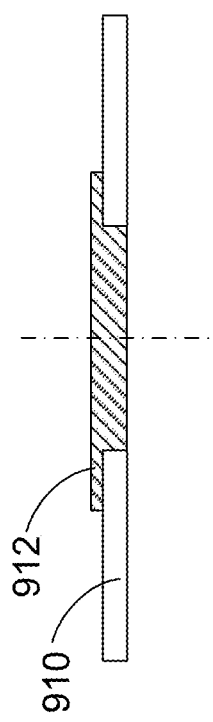

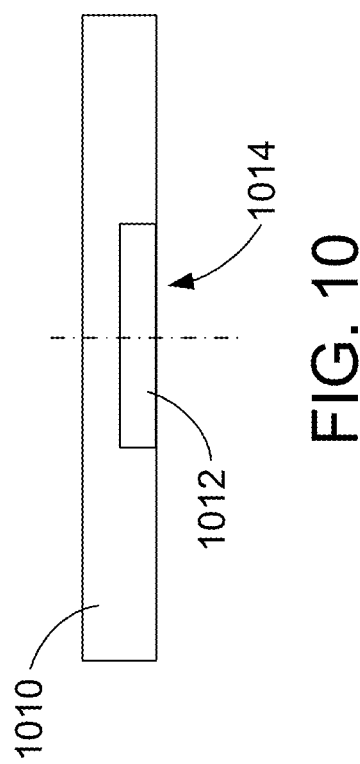

TILED LIGHT EMITTING DIODE DISPLAY PANEL HAVING DIFFERENT RESISTANCE PER UNIT LENGTH SIGNAL LINES

FIELD

The disclosure relates generally to display technology, and more particularly to a tiled light emitting diode (LED) display and a method for manufacturing the same.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A light emitting diode (LED) display is a flat panel emissive display that is self-emitting, using individual LED chips as the emitters. In a large area flat panel emissive display, the resistor and capacitor (RC) delay of the thin film signal lines and the copper loss (also known as the IR loss) of power lines will degrade the performance of the display panel.

Therefore, a heretofore unaddressed need exists in the art to address the aforementioned deficiencies and inadequacies.

SUMMARY

One aspect of the disclosure relates to a tiled light emitting diode (LED) display panel, which includes: a plurality of flexible back plates arranged in tiles, wherein each of the flexible back plates has a first side and a second side opposite to each other, and has a plurality of through holes formed thereon; a pixel array formed by a plurality of LEDs on the flexible back plates, collectively defining a plurality of pixels, wherein each of the pixels comprises one of the LEDs and thin-film transistor (TFT) circuits disposed on the first side of a corresponding one of the flexible back plates; a printed circuit board (PCB) disposed at the second side of the flexible back plates, wherein the PCB has a third side and a fourth side opposite to each other, and the third side of the PCB faces the second side of the flexible back plates; a plurality of signal lines formed on the third side of the PCB; a plurality of sub signal lines formed on the flexible back plates, correspondingly electrically connected to the LEDs and the TFT circuits of the pixels; and a plurality of conductive structures formed in the through holes, wherein the sub signal lines are electrically connected to the corresponding signal lines via the conductive structures, wherein a resistance per unit length of the sub signal lines formed on each of the flexible back plates is greater than a resistance per unit length of the PCB and the signal lines formed thereon.

In certain embodiments, a thickness and a width of each of the signal lines are greater than a thickness and a width of each of the sub signal lines.

In certain embodiments, the signal lines comprise a plurality of data lines extending along a first direction, a plurality of scan lines extending along a second direction, and a plurality of power lines; and the sub signal lines comprise a plurality of sub data lines extending along the first direction, a plurality of sub scan lines extending along the second direction, and a plurality of sub power lines, each of the sub data lines is electrically connected to a corresponding one of the data lines, each of the sub scan lines is electrically connected to a corresponding one of the scan lines, and each of the sub power lines is electrically connected to a corresponding one of the power lines.

In certain embodiments, the through holes are aligned in a direction different from the first direction and the second direction.

In certain embodiments, each of the through holes has a diameter greater than 10 um.

In certain embodiments, the conductive structures are electrically connected to the corresponding signal lines through soldering or by anisotropic conductive films (ACFs).

In certain embodiments, the through holes are formed at a border area of the flexible back plates.

In certain embodiments, the through holes are formed in an active area of the flexible back plates.

In certain embodiments, the LEDs are organic LEDs (OLEDs), and each of the flexible back plates is further provided with a thin-film encapsulation (TFE) layer divided in at least two regions to cover the OLEDs, and the TFE layer in each of the at least two regions covers at least one of the OLEDs on each of the flexible back plates.

In certain embodiments, the tiled LED display panel further includes at least one signal integrated circuit (IC) disposed on the PCB, configured to provide signals to the signal lines correspondingly.

In certain embodiments, the at least one signal IC are disposed at a border area on the third side of the PCB.

In certain embodiments, the at least one signal IC are disposed on the fourth side of the PCB.

In certain embodiments, for a respective through hole of the through holes, one of the TFT circuits corresponding to the respective through hole and a respective conductive structure of the conductive structures corresponding to the respective through hole is formed with a hole corresponding to the respective through hole.

In certain embodiments, for the respective through hole of the through holes, the TFT circuits corresponding to the respective through hole has a surrounding portion surrounding the hole and the respective through hole, and the respective conductive structure is formed by a solder material attached to a side wall of the through hole and connected to the surrounding portion.

In certain embodiments, for the respective through hole of the through holes, the TFT circuits corresponding to the respective through hole has a surrounding portion surrounding the hole and the respective through hole and attached to a side wall of the through hole, and the respective conductive structure is formed by a solder material attached to the side wall of the through hole and connected to the surrounding portion.

In certain embodiments, for the respective through hole of the through holes, the TFT circuits corresponding to the respective through hole has a filler portion filled in a part of the respective through hole, and the respective conductive structure is formed by a solder material having the hole and connected to the filler portion.

Another aspect of the disclosure relates to a LED display panel, which includes: a flexible back plate having a first side and a second side opposite to each other, and a plurality of through holes formed thereon; a pixel array formed by a plurality of LEDs on the flexible back plate, collectively defining a plurality of pixels, wherein each of the pixels comprises one of the LEDs and thin-film transistor (TFT) circuits disposed on the first side of the flexible back plate;

a printed circuit board (PCB) disposed at the second side of the flexible back plate, wherein the PCB has a third side and a fourth side opposite to each other, and the third side of the PCB faces the second side of the flexible back plate; a plurality of signal lines formed on the third side of the PCB; a plurality of sub signal lines formed on the flexible back plates, correspondingly electrically connected to the LEDs and the TFT circuits of the pixels; and a plurality of conductive structures formed in the through holes, wherein the sub signal lines are electrically connected to the corresponding signal lines via the conductive structures, wherein for a respective through hole of the through holes, one of the TFT circuits corresponding to the respective through hole and a respective conductive structure of the conductive structures corresponding to the respective through hole is formed with a hole corresponding to the respective through hole.

In certain embodiments, a resistance per unit length of the sub signal lines formed on the flexible back plate is greater than a resistance per unit length of the PCB and the signal lines formed thereon.

In certain embodiments, the signal lines comprise a plurality of data lines extending along a first direction, a plurality of scan lines extending along a second direction, and a plurality of power lines; and the sub signal lines comprise a plurality of sub data lines extending along the first direction, a plurality of sub scan lines extending along the second direction, and a plurality of sub power lines, each of the sub data lines is electrically connected to a corresponding one of the data lines, each of the sub scan lines is electrically connected to a corresponding one of the scan lines, and each of the sub power lines is electrically connected to a corresponding one of the power lines.

In certain embodiments, a thickness and a width of each of the signal lines are greater than a thickness and a width of each of the sub signal lines.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein:

FIG. 7A schematically shows a partial top view of the flexible back plate around a through hole according to certain embodiments of the present disclosure.

FIG. 7B schematically shows a partial top view of the PCB around a conductive structure according to certain embodiments of the present disclosure.

FIG. 7C schematically shows a side cross-sectional view of the flexible back plate as shown in FIG. 7A and the PCB as shown in FIG. 7B along the A-A' and B-B' directions.

FIG. 7D schematically shows the structure of FIG. 7C before heating according to certain embodiments of the present disclosure.

FIG. 7E schematically shows the structure of FIG. 7C after heating according to certain embodiments of the present disclosure.

FIGS. 8E-8G schematically show steps of forming the through hole on the flexible back plate as shown in FIG. 8C according to certain embodiments of the present disclosure.

FIGS. 9D-9F schematically show steps of forming the through hole on the flexible back plate as shown in FIG. 9C according to certain embodiments of the present disclosure.

FIG. 10 schematically shows a side cross-sectional view of a flexible back plate having a blinded hole according to certain embodiments of the present disclosure.

DETAILED DESCRIPTION OF THE DISCLOSURE

Figure 1:
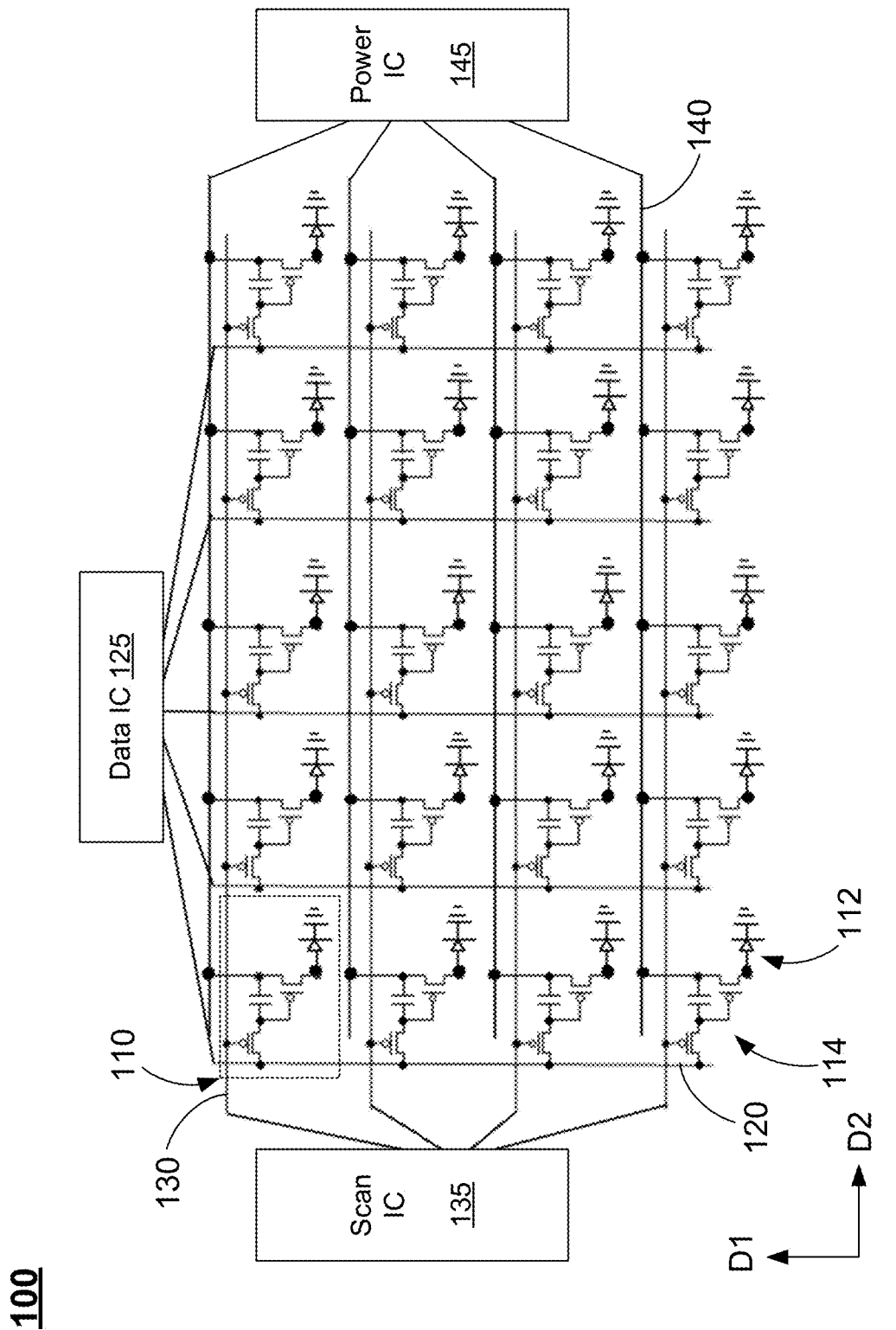
FIG. 1 schematically shows the circuitry of a thin-film transistor (TFT) driven large area emissive diode display panel according to certain embodiment of the present disclosure.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The description will be made as to the embodiments of the present disclosure in conjunction with the accompanying drawings. In accordance with the purposes of this disclosure, as embodied and broadly described herein, this disclosure, in certain aspects, relates to a display panel and a display device using the same.

As discussed above, in the large area flat panel emissive display, the RC delay of the thin film signal lines and the IR loss of power lines will degrade the performance of the display panel. For example, FIG. 1 schematically shows the circuitry of a TFT driven large area emissive diode display panel. As shown in FIG. 1, the display panel 100 has a substrate (not shown) having the circuitry formed thereon. In certain embodiments, the substrate may be a transparent glass substrate or other types of substrate. Specifically, the circuitry includes a pixel array having a plurality of pixels, and each pixel has a corresponding pixel circuit 110. Each pixel circuit 110 includes a LED 112 and corresponding TFT circuits 114, which may be formed by a plurality of TFTs and other electronic components such as a capacitor. Specifically, in the TFT circuits 114 of each pixel, there are two TFTs and a capacitor to regulate the brightness of the LED 112. In certain embodiments, the LED 112 can be an organic LED (OLED) or an inorganic mini-LED or micro-LED. Further, the display panel 100 includes a plurality of signal lines as well as a plurality of signal driving circuits for providing signals to the signal lines correspondingly. In certain embodiments, the signal driving circuits can be signal ICs. The signal lines include a plurality of data lines 120, a plurality of scan lines 130 and a plurality of power lines 140. Correspondingly, the signal ICs include a data IC 125, a scan IC 135 and a power IC 145. The data lines 120 extend along a first direction D1 (i.e., the vertical direction as shown in FIG. 1) and are connected to the data IC 125, such that data signals provided by the data IC 125 may be transmitted to the pixel circuits 110 of all pixels through the data lines 120. The scan lines 130 extend along a second direction D2 (i.e., the horizontal direction as shown in FIG. 1) and are connected to the scan IC 135, such that scan signals provided by the scan IC 135 may be transmitted to the pixel circuits 110 of all pixels through the scan lines 130. The power lines 140 also extend along the second direction and are connected to the power IC 145, such that power provided by the power IC 145 may be transmitted to the LEDs 112 of the pixels through the power lines 140. In certain embodiments, the power lines 140 can be arranged to extend along the first direction.

In the display panel 100 as shown in FIG. 1, the signal lines 120, 130 and 140 on the substrate have high resistance, such that RC delay will distort the scan and data signals, and IR loss of power lines will cause high power consumption and high heat for the panel. The RC delay and IR loss will be significant when the size of the display panel 100 increases, thus prohibiting the expansion of the size of the display panel 100.

To remedy the deficiency, one aspect of the disclosure relates to a tiled light emitting diode (LED) display panel, which has a plurality of tiled small sized sub-panels that may be assembled into a large sized display panel. In the tiled panel structure, the signal lines (such as scan lines, data lines and power lines) of a large area display panel are conducted on a multilayered PCB having a large area, and the signals are transferred to individual sub-panels which are fabricated on plastic flexible substrates. Since the signal lines are provided on the PCB, the transmission of the signals (such as the data signals, scan signals and power) are delegated to the conductors on the PCB, which may have lower resistance and capacitance, thus minimizing the RC degradation of signals and IR loss. Meanwhile, the TFT circuits, which provide the display functions, remain on the individual LED sub-panels, where the thicknesses of the bus lines are limited to less than one microns because thin film processing constraints and the widths of the bus lines are limited to a few microns due to aperture ratio constraints. Since the bus lines on the PCB may be relatively wider and thicker, the resistances and capacitances can be much lower, such that the RC signal degradation and IR loss may be reduced, and the gaps between subpanels may be minimized. Further, the subpanels are better aligned and the border areas of the panel are minimized.

Figure 2A:
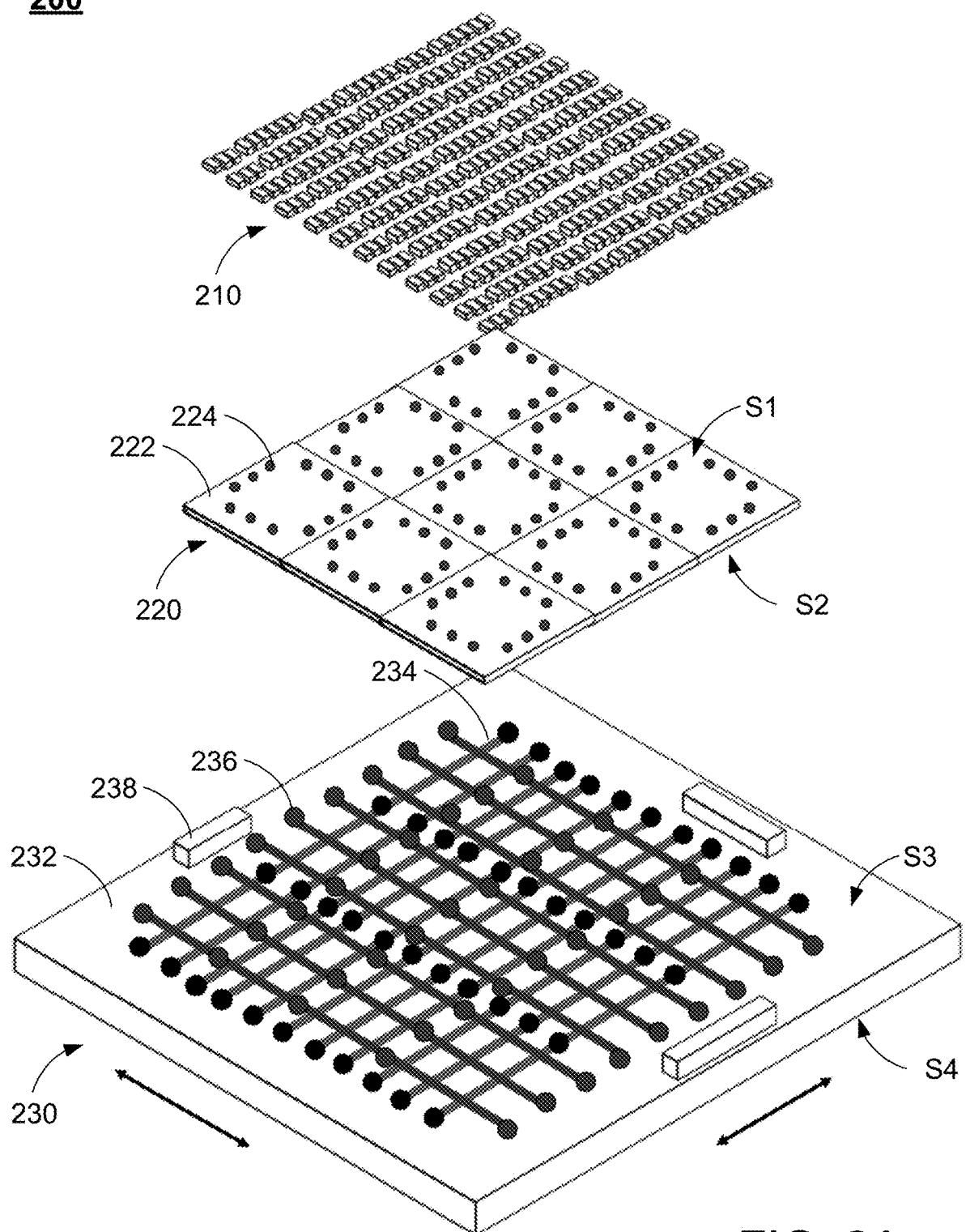
FIG. 2A schematically shows an exploded view of a tiled LED display panel according to certain embodiments of the present disclosure.
Figure 2B:
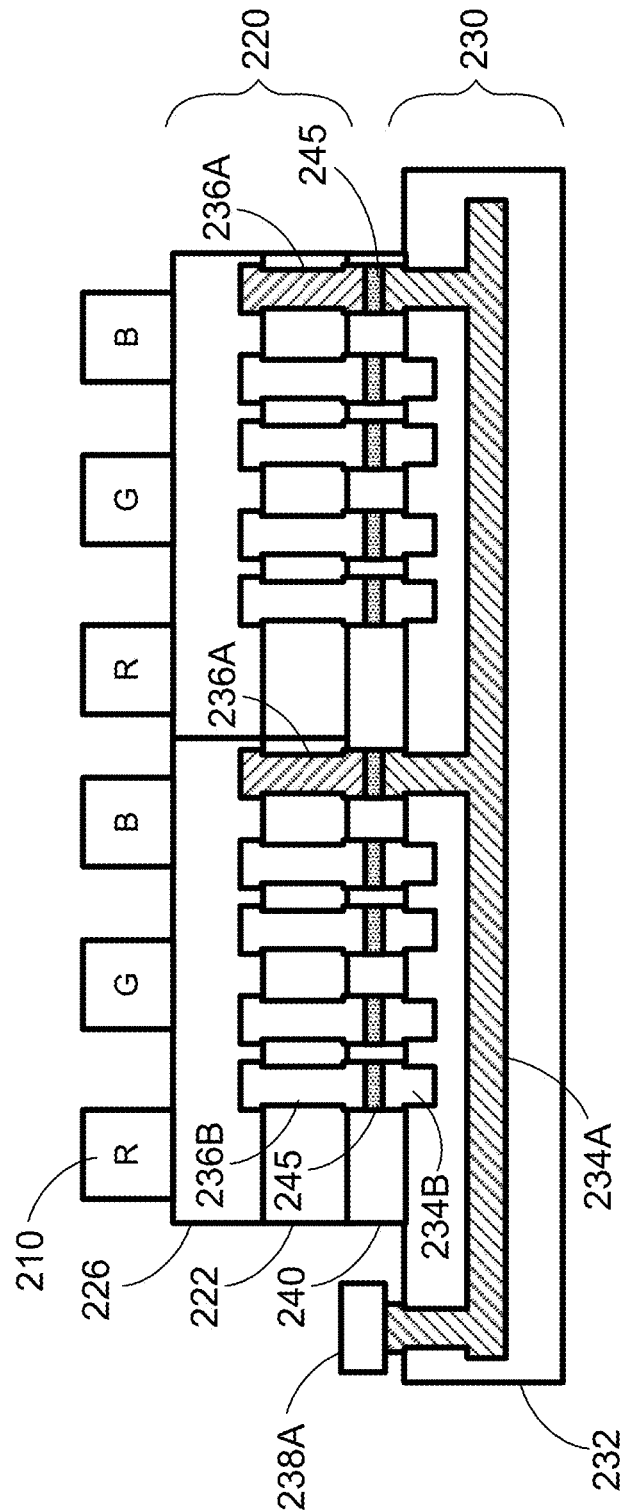
FIG. 2B schematically shows an assembled cross-sectional view of the tiled LED display panel as shown in FIG. 2A according to one embodiment of the present disclosure.
Figure 2C:
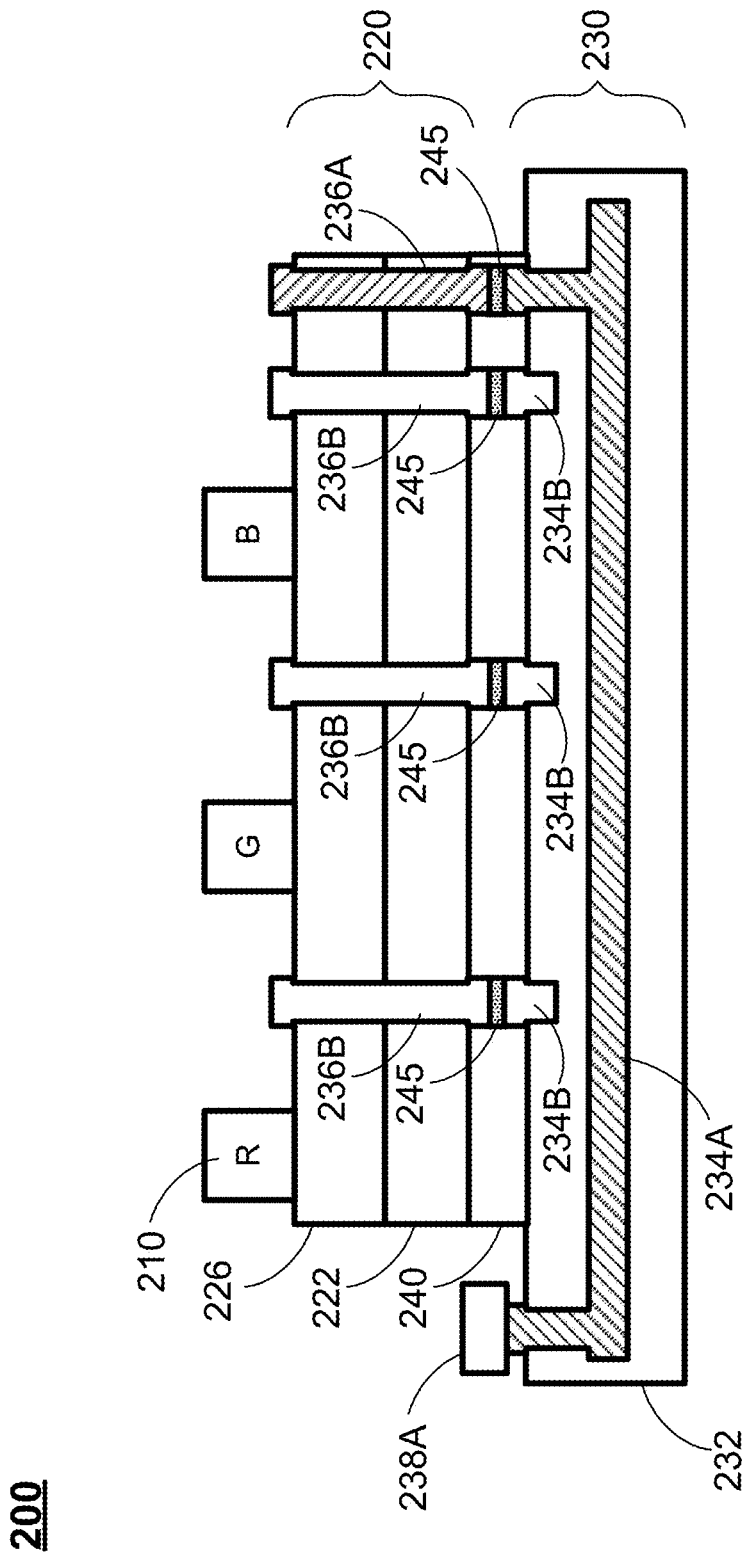
FIG. 2C schematically shows an assembled cross-sectional view of the tiled LED display panel as shown in FIG. 2A according to one embodiment of the present disclosure.
Figure 2D:
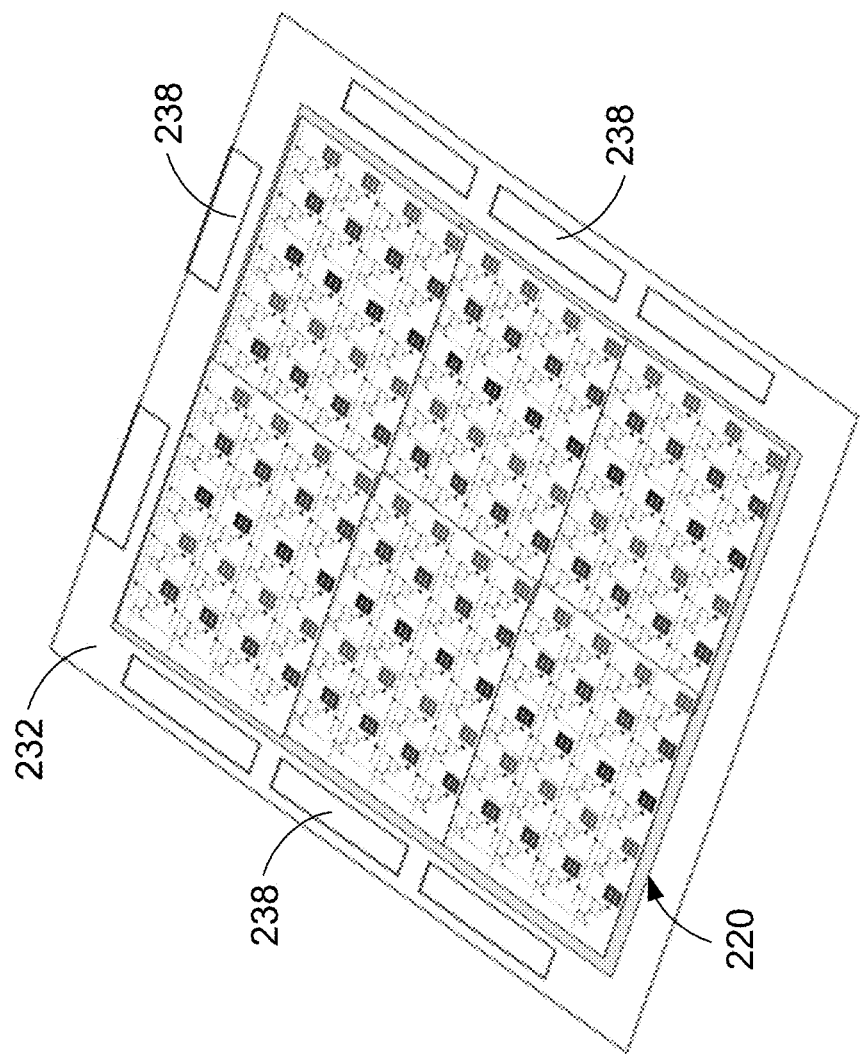
FIG. 2D schematically shows an assembled perspective view of the tiled LED display panel as shown in FIG. 2A.

FIGS. 2A-2D schematically show a tiled LED display panel according to certain embodiments of the present disclosure. As shown in FIG. 2A, the tiled LED display panel 200 includes: a plurality of LEDs 210, a tiled flexible back plate module 220, and a printed circuit board (PCB) 230. Specifically, the tiled flexible back plate module 220 has a plurality of flexible back plates 222 arranged in tiles. Each of the flexible back plates 222 has a first side S1 (i.e., a top side as shown in FIG. 2A) and a second side S2 (i.e., a bottom side as shown in FIG. 2A) opposite to each other, and has a plurality of through holes 224 formed thereon. In certain embodiments, the through holes 224 may be formed by laser drilling on the flexible back plates 222, and each through hole 224 may have a diameter of about 10 um or larger. As shown in FIG. 2A, the through holes 224 are formed at a border area of the flexible back plates 222. Further, a pixel array is formed by the LEDs 210 on the flexible back plates 222, collectively defining a plurality of pixels. In other words, each flexible back plate 222 has a portion of the pixel arrays formed thereon. Each pixel includes one LED 210 and corresponding TFT circuits 226 (see FIG. 2B) disposed on the first side of the corresponding flexible back plate 222. In certain embodiments, the LEDs 210 may include LEDs in different colors. For example, the LEDs 210 may include a plurality of red (R) LEDs, a plurality of green (G) LEDs, and a plurality of blue (B) LEDs. It should be noted that, on the flexible back plates 222, there are only sub signal lines (not shown in FIGS. 2A and 2B, will be described later). Instead, the PCB module 230, which is disposed at the second side S2 (i.e., the bottom side) of the flexible back plates 222, includes a PCB 232 and the signal lines 234 and a plurality of signal ICs 238 formed thereon. Specifically, the PCB 232 has a third side S3 (i.e., the top side as shown in FIG. 2A) and a fourth side S4 (i.e., the bottom side as shown in FIG. 2A) opposite to each other, and the third side S3 of the PCB 232 faces the second side S2 of the flexible back plates 222. The signal lines 234 and the signal ICs 238 are formed on the third side S3 of the PCB 232 facing the flexible back plates 222. It should be noted that the crossover of the signal lines 234 may be solved by disposing the signal lines 234 on different layers of the PCB 232, and the layers of the PCB may be separated by insulating layers that are relatively thick, such that the capacitances of the signal lines 234 are much lower. Further, the signal ICs 238 are disposed at a peripheral border area on the third side of the PCB 232. In certain embodiments, the signal lines 234 may include the data lines 120, the scan lines 130 and the power lines 140 as shown in FIG. 1, and the signal ICs 238 may include the data IC 125, the scan IC 135 and the power IC 145 as shown in FIG. 1. Further, the PCB module 230 also includes a plurality of conductive structures 236 formed on the PCB 232. The locations of the conductive structures 236 correspond to those of the through holes 224, such that when the display panel 200 is assembled, the conductive structures 236 may correspondingly locate in the through holes 224. Thus, the LEDs 210 and the TFT circuits of the pixels on the flexible back plates 222 may be electrically connected to the corresponding sub signal lines (not shown in FIG. 2A), which are electrically connected to the corresponding signal lines 234 via the conductive structures 236. FIG. 2D shows an assembled perspective view of the tiled LED display panel as shown in FIG. 2A.

FIGS. 2B and 2C show the cross-sectional views of the tiled LED display panel as shown in FIG. 2A. Specifically, the cross-sectional view of the tiled LED display panel 200 as shown in each of FIGS. 2B and 2C is taken along the first direction D1 (i.e., the extending direction of the data lines). As shown in FIG. 2B, multiple pixels on two flexible back plates 222 of the flexible back plate module 220 are shown. Specifically, the TFT circuits 226 and the LEDs 210 are disposed on each of the flexible back plates 222. In the PCB module 230, the signal lines 234 on the PCB 232 include a plurality of data lines 234A and a plurality of scan lines 234B. At the border area on the third side S3 (i.e., the top side) of the PCB 232, a data IC 238A is provided to be electrically connected to the data lines 234A. In addition, a plurality of conductive structures 236A corresponding to the data lines 234A and a plurality of conductive structures 236B corresponding to the scan lines 236A are correspondingly provided. Further, a plurality of connection structures 245 are provided between the signal lines 234A and 234B and the conductive structures 236A and 236B, such that each of the data lines 234A is electrically connected to a corresponding conductive structure 236A via one of the connection structures 245, and each of the scan lines 234B is electrically connected to a corresponding conductive structure 236B via one of the connection structures 245. Moreover, an adhesive layer 240 is disposed between the flexible back plates 222 and the PCB 232 to surround the connection structures 245, such that the flexible back plates 222 and the PCB 232 are firmly attached together. In this case, the TFT circuits 226 and the LEDs 210 are electrically connected to the signal lines (including the data lines 234A and the scan lines 234B) via the conductive structures 236A and 236B correspondingly. In certain embodiments, the connection structures 245 may be soldering structures or conductive paste or anisotropic conductive films (ACFs).

As shown in FIG. 2C, multiple pixels on one flexible back plate 222 of the flexible back plate module 220 is shown. The difference between the display panel 200 as shown in FIG. 2C from the display panel 200 as shown in FIG. 2B exists in that the conductive structures 236A and 236B extend further to reach the top of the TFT circuits 226.

It should be particularly noted that FIGS. 2B and 2C merely shows the components of the display panels in schematic views, and the size and thickness of the layers as shown in FIGS. 2B and 2C are not to scale. For example, the flexible back plate 222 can be relatively thin layers, having a thickness of less than 70 micrometers. Further, the TFT circuits 226 as shown in FIGS. 2B and 2C are shown collectively as a layer on the corresponding flexible back plate 222, which includes multiple signal lines for each of the TFT circuits, and the LEDs 210 are disposed on the layer of the TFT circuits 226. However, the TFT circuit 226 is a thin layer, and the LEDs 210 should be disposed on the corresponding flexible back plate 222. Specifically, a thickness and a width of each of the signal lines 234 are greater than a thickness and a width of each of the TFT circuits on the flexible back plates 222. Thus, a resistance per unit length of the sub signal lines formed on each of the flexible back plates 222 is greater than a resistance per unit length of the PCB 232 and the signal lines 234 formed on PCB 232.

Figure 3A:
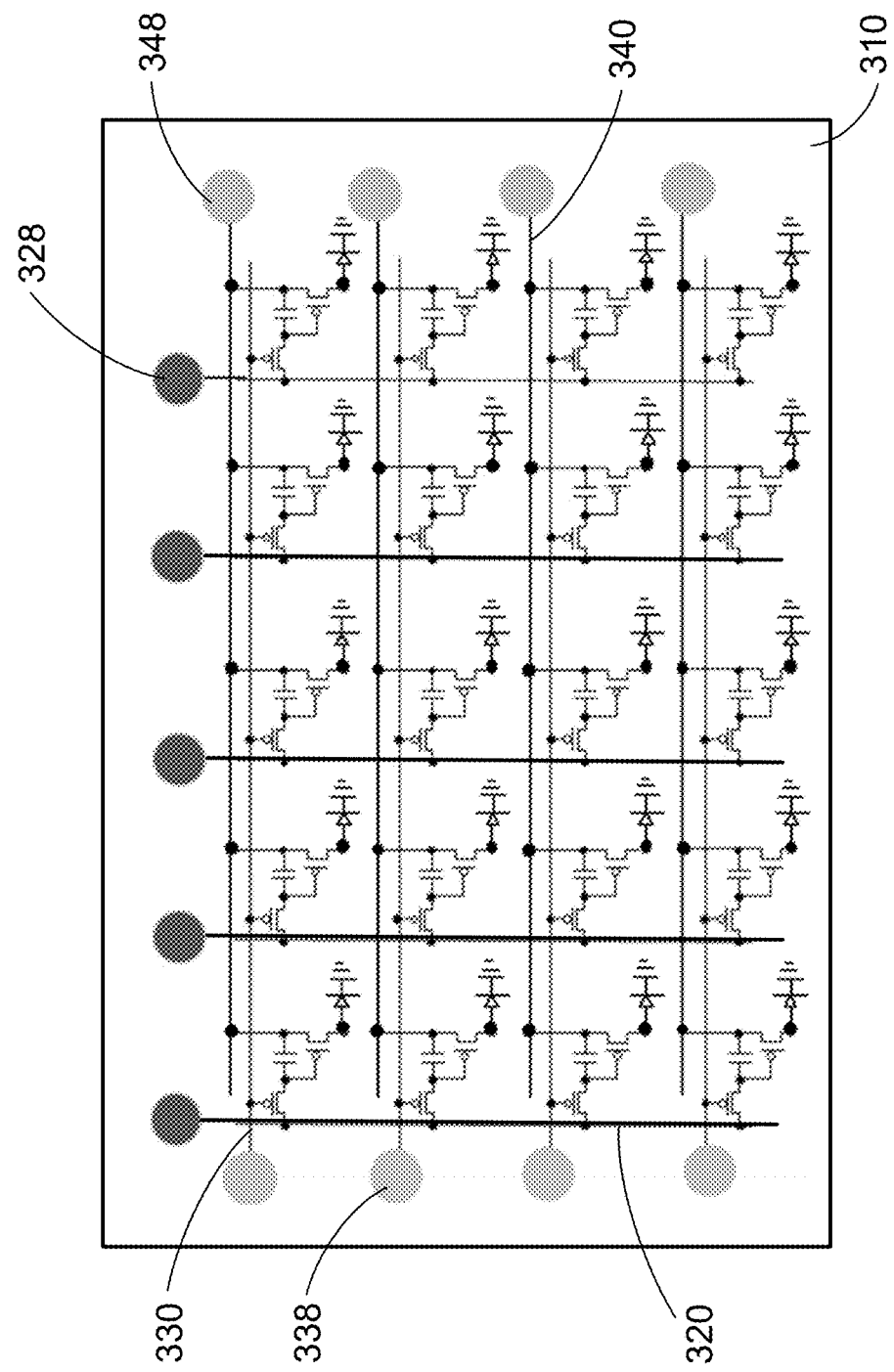
FIG. 3A schematically shows an assembled top view of a flexible back plate of the tiled LED display panel according to certain embodiments of the present disclosure, where the through holes are formed at a border area on the flexible back plate.
Figure 3B:
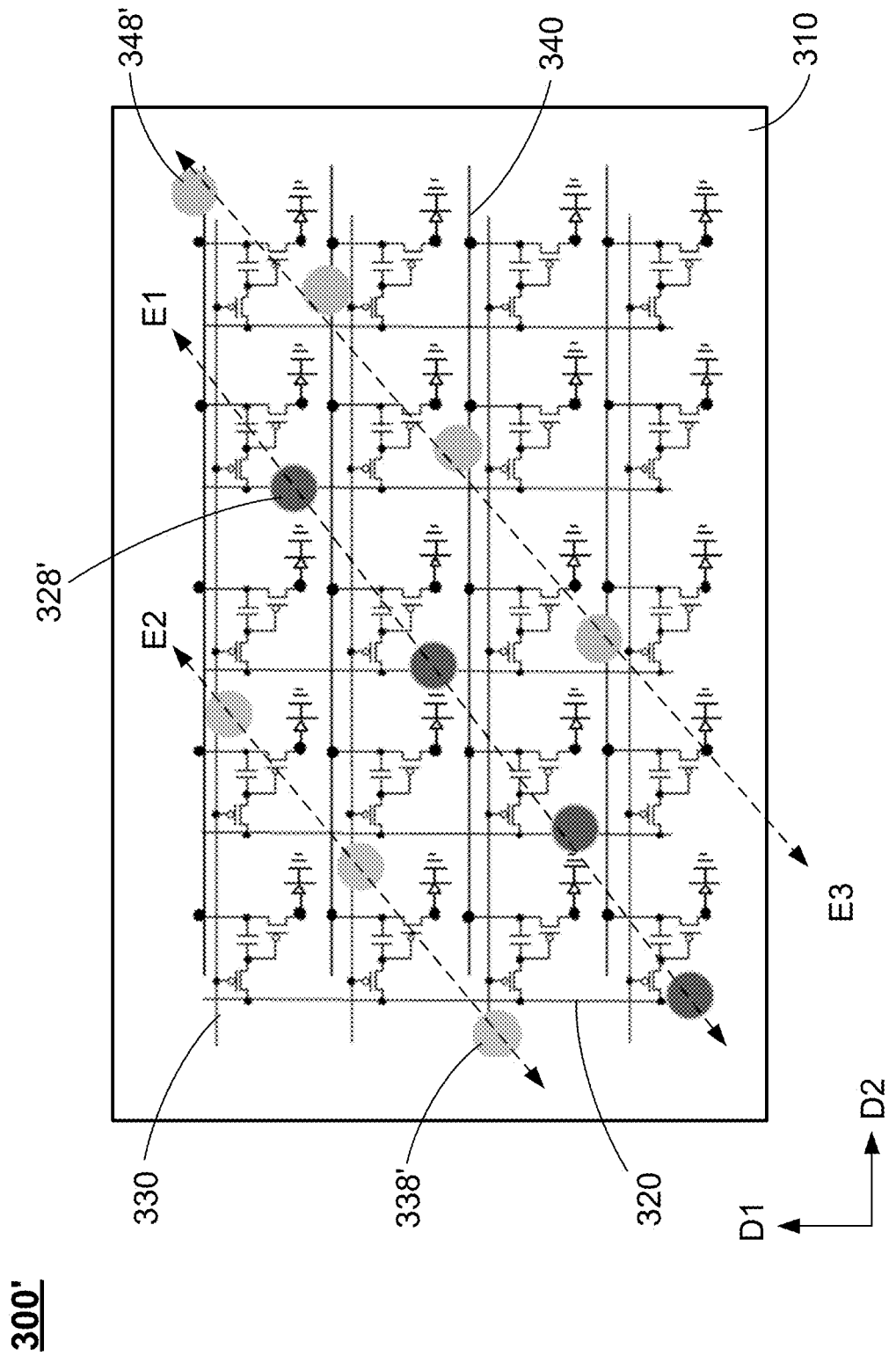
FIG. 3B schematically shows an assembled top view of a flexible back plate of the tiled LED display panel according to certain embodiments of the present disclosure, where the through holes are formed in an active area on the flexible back plate.

In certain embodiments, the positions of the through holes on the flexible back plates may vary. For example, FIGS. 3A and 3B schematically show assembled top views of the tiled LED display panel with different arrangements of the through holes. Specifically, each of FIGS. 3A and 3B shows one flexible back plate 310 assembled with the PCB (not shown). Since the flexible back plate 310 and the PCB are assembled, the conductive structures are located within the corresponding through holes. In other words, the positions of the conductive structures are identical to the positions of the through holes. As shown in FIGS. 3A and 3B, the flexible back plate 310 includes a plurality of sub signal lines. Specifically, the sub signal lines may include the sub data lines 320, the sub scan lines 330 and the sub power lines 340. In certain embodiments, each of the sub signal lines is electrically connected to a corresponding signal line via a corresponding conductive structure. Using FIG. 3A as an example, each sub data line 320 is electrically connected to a corresponding data line via a corresponding conductive structure 328, each sub scan line 330 is electrically connected to a corresponding scan line via a corresponding conductive structure 338, and each sub power line 340 is electrically connected to a corresponding power line via a corresponding conductive structure 348.

As shown in FIG. 3A, the conductive structures 328 corresponding to the sub data lines 320 are located at the top border area of the flexible back plate 310, the conductive structures 338 corresponding to the sub scan lines 330 are located at the left border area of the flexible back plate 310, and the conductive structures 348 corresponding to the sub power lines 340 are located at the right border area of the flexible back plate 310. Thus, all of the through holes are formed at the border area of the flexible back plate 310. In contrast, as shown in FIG. 3B, the conductive structures 328', 338' and 348' are all arranged in the active area of the flexible back plate 310. Specifically, the sub data lines 320 extend along a first direction D1 (i.e., the vertical direction as shown in FIG. 3B), and the sub scan lines 330 and the sub power lines 340 extend along a second direction D2 (i.e., the horizontal direction as shown in FIG. 3B). The extending directions of the sub signal lines are in parallel to the corresponding signal lines on the PCB. For example, the sub data lines 320 and the corresponding data lines all extend in the first direction D1, and the sub scan lines 330, the sub power lines 340 and the corresponding scan lines and power lines all extend in the second direction D2. Further, the conductive structures 328' corresponding to the sub data lines 320 are aligned substantially in a first extending direction E1, the conductive structures 338' corresponding to the sub scan lines 330 are aligned substantially in a second extending direction E2, and the conductive structures 348' corresponding to the sub power lines 340 are aligned substantially in a third extending direction E3. Each of the first extending direction E1, the second extending direction E2 and the third extending direction E3 is a slant direction, which is different from the first direction D1 or the second direction D2. In summary, each sub scan line on a flexible back plate is electrically connected to a corresponding scan line on the PCB via a corresponding conductive structure located at a corresponding through hole. Each sub data line on a flexible back plate is electrically connected to a corresponding data line on the PCB via a corresponding conductive structure located at a corresponding through hole. Each sub power line on a flexible back plate is electrically connected to a corresponding power line on the PCB via a corresponding conductive structure located at a corresponding through hole.

Figure 4A:
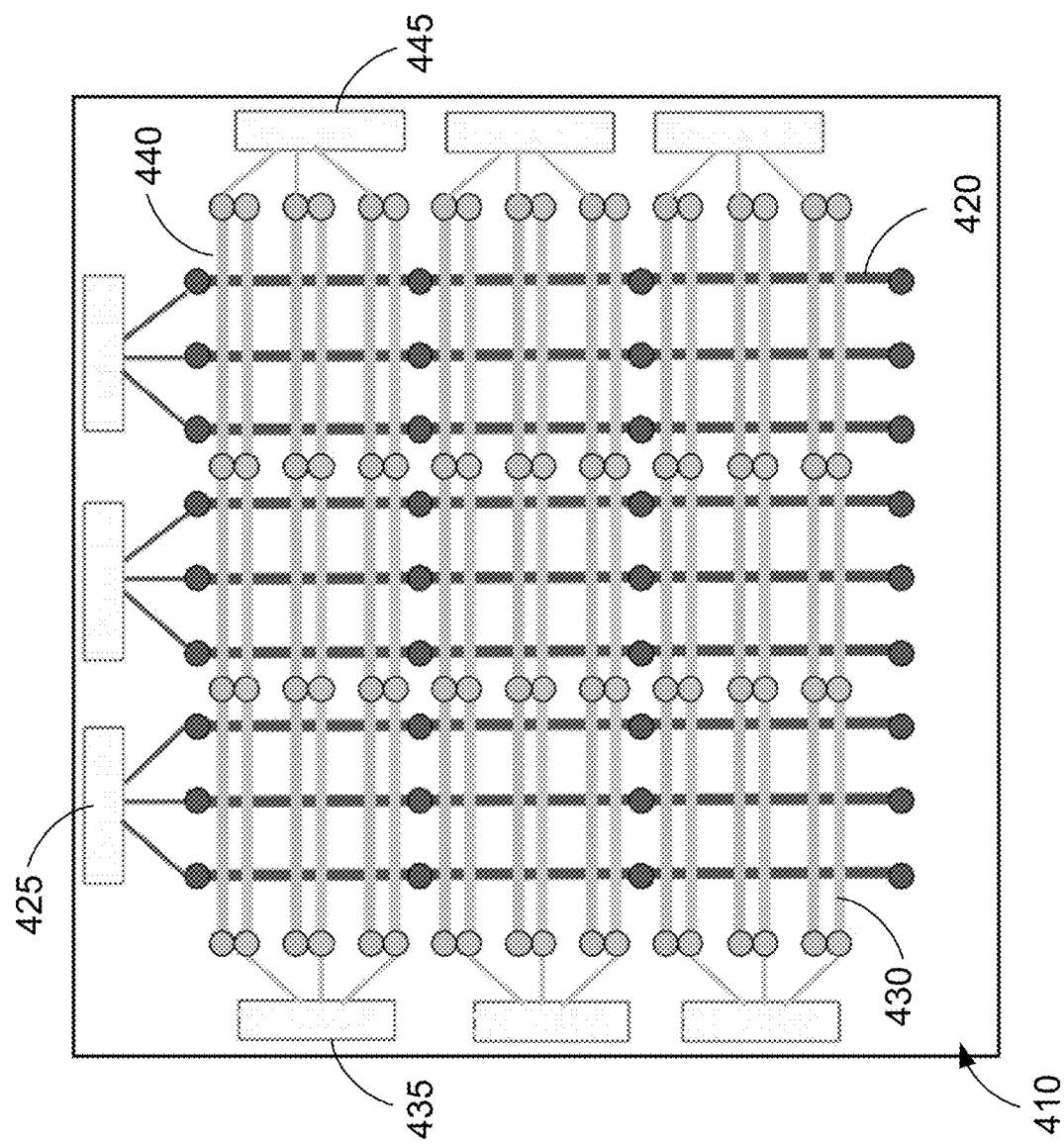
FIG. 4A schematically shows a top view of the PCB module of the tiled LED display panel according to certain embodiments of the present disclosure, where the signal ICs are disposed on the third side of the PCB.
Figure 4B:
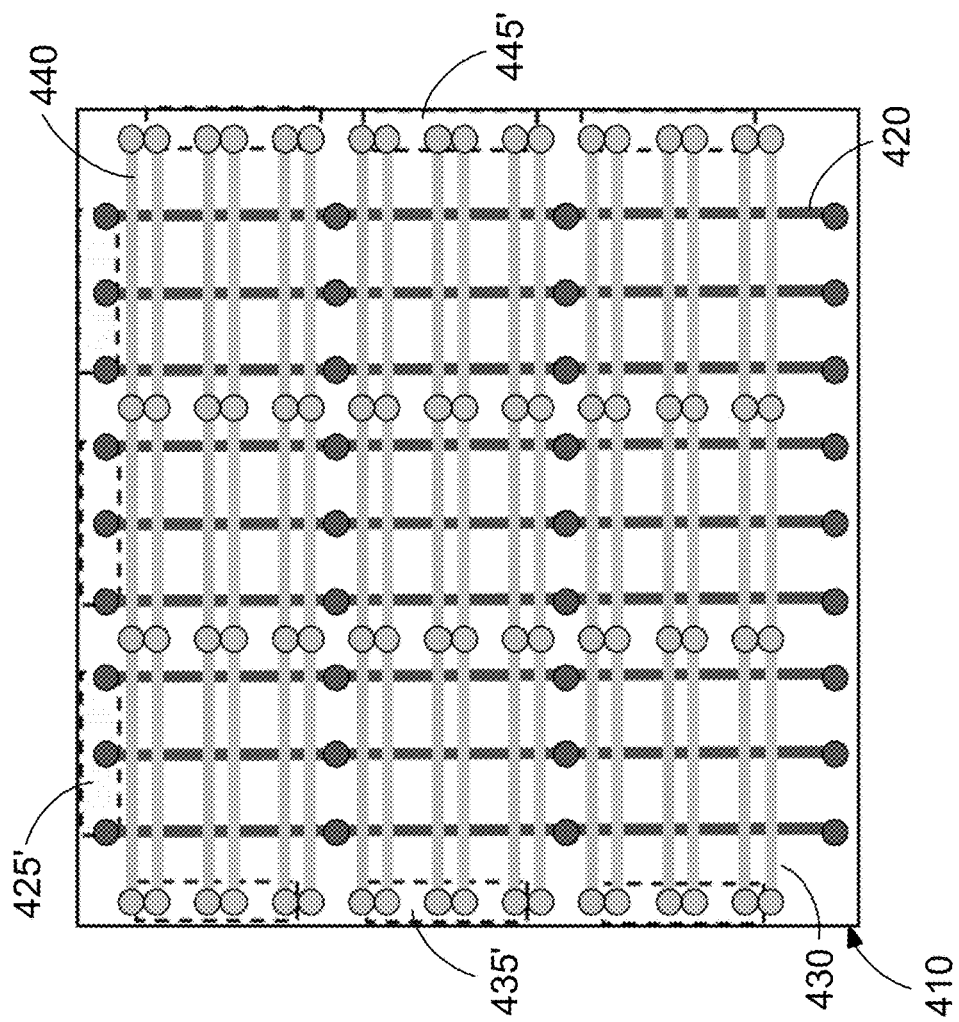
FIG. 4B schematically shows a top view of the PCB module of the tiled LED display panel according to certain embodiments of the present disclosure, where the signal ICs are disposed on the fourth side of the PCB.

In certain embodiments, the positions of the signal ICs on the PCB may vary. For example, FIGS. 4A and 4B schematically show top views of the PCB module of the tiled LED display panel according to certain embodiments of the present disclosure. As shown in FIG. 4A, the PCB module 400 includes a PCB 410, and the signal lines disposed on the PCB 410 include the data lines 420, the scan lines 430, and the power lines 440. Correspondingly, the signal ICs disposed on the PCB 410 include the data ICs 425 electrically connected to the data lines 420, the scan ICs 435 electrically connected to the scan lines 430, and the power ICs 445 electrically connected to the power lines 440. The data ICs 425, the scan ICs 435 and the power ICs 445 are all disposed at a border area on the third side S3 (i.e., the top side) of the PCB 410.

In comparison, as shown in FIG. 4B, the PCB module 400' includes a PCB 410, and the signal lines disposed on the PCB 410 are the same signal lines, including the data lines 420, the scan lines 430, and the power lines 440. Correspondingly, the signal ICs disposed on the PCB 410 are also the same signal ICs, including the data ICs 425' electrically connected to the data lines 420, the scan ICs 435' electrically connected to the scan lines 430, and the power ICs 445' electrically connected to the power lines 440. The difference exists in that the data ICs 425', the scan ICs 435' and the power ICs 445' are all disposed on the fourth side S4 (i.e., the bottom side) of the PCB 410. In this case, the requirement of the signal ICs being disposed at the border area of the PCB 410 may be eliminated, further reducing the border area of the PCB 410, and minimizing the size of the PCB 410.

Figure 5A:
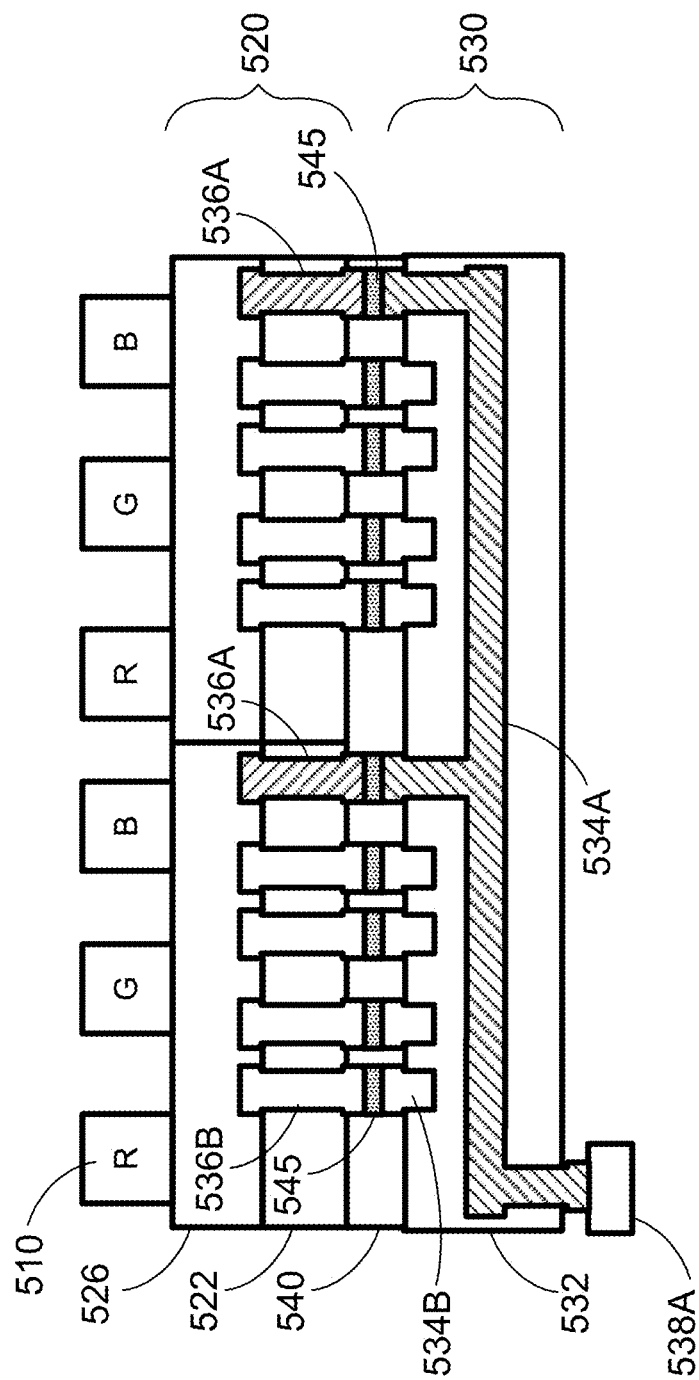
FIG. 5A schematically shows an assembled cross-sectional view of the tiled LED display panel according to one embodiment of the present disclosure, where the data IC is disposed on the fourth side of the PCB.
Figure 5B:
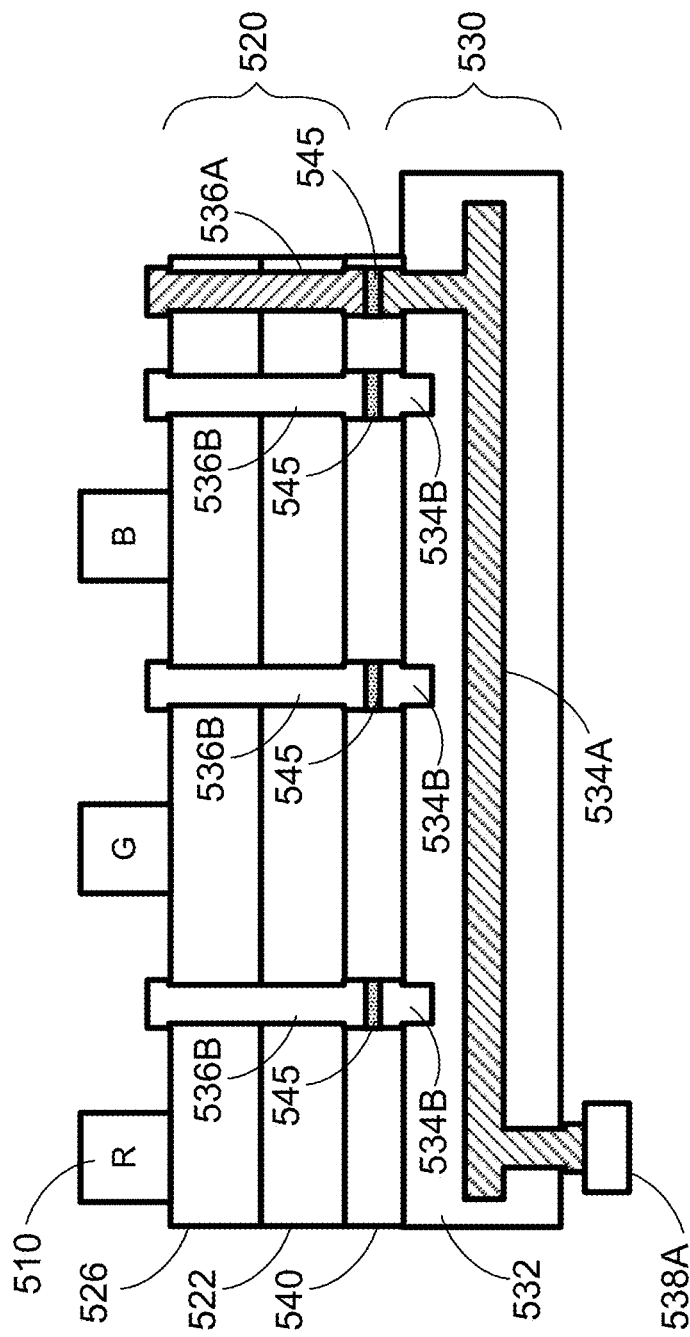
FIG. 5B schematically shows an assembled cross-sectional view of the tiled LED display panel according to one embodiment of the present disclosure, where the data IC is disposed on the fourth side of the PCB.

FIGS. 5A and 5B shows the cross-sectional views of a tiled LED display panel according to certain embodiments of the present disclosure, where the signal ICs are disposed on the fourth side S4 of the PCB. Specifically, the cross-sectional view of the tiled LED display panel 500 as shown in each of FIGS. 5A and 5B is taken along the first direction D1 (i.e., the extending direction of the data lines). As shown in FIG. 5A, multiple pixels on two flexible back plates 522 of the flexible back plate module 520 are shown. As shown in FIG. 5B, multiple pixels on one flexible back plate 522 of the flexible back plate module 520 is shown. The only difference between the tiled LED display panel 500 as shown in FIGS. 5A and 5B and the tiled LED display panel 200 as shown in FIGS. 2B and 2C exists in the data IC 538A, which is disposed on the fourth side (i.e., the bottom side) of the PCB 532. Other components of the tiled LED display panel 500, including the LEDs 510, the flexible back plates 522, the TFT circuits 526, the scan lines 534B, the conductive structures 536A and 536B, the adhesive layer 540 and the connection structures 545, are all similar to the corresponding components of the tiled LED display panel 200 as shown in FIGS. 2B and 2C, including the LEDs 210, the flexible back plates 222, the TFT circuits 226, the scan lines 234B, the conductive structures 236A and 236B, the adhesive layer 240 and the connection structures 245. Thus, details of these similar components are not further elaborated herein.

Figure 6:
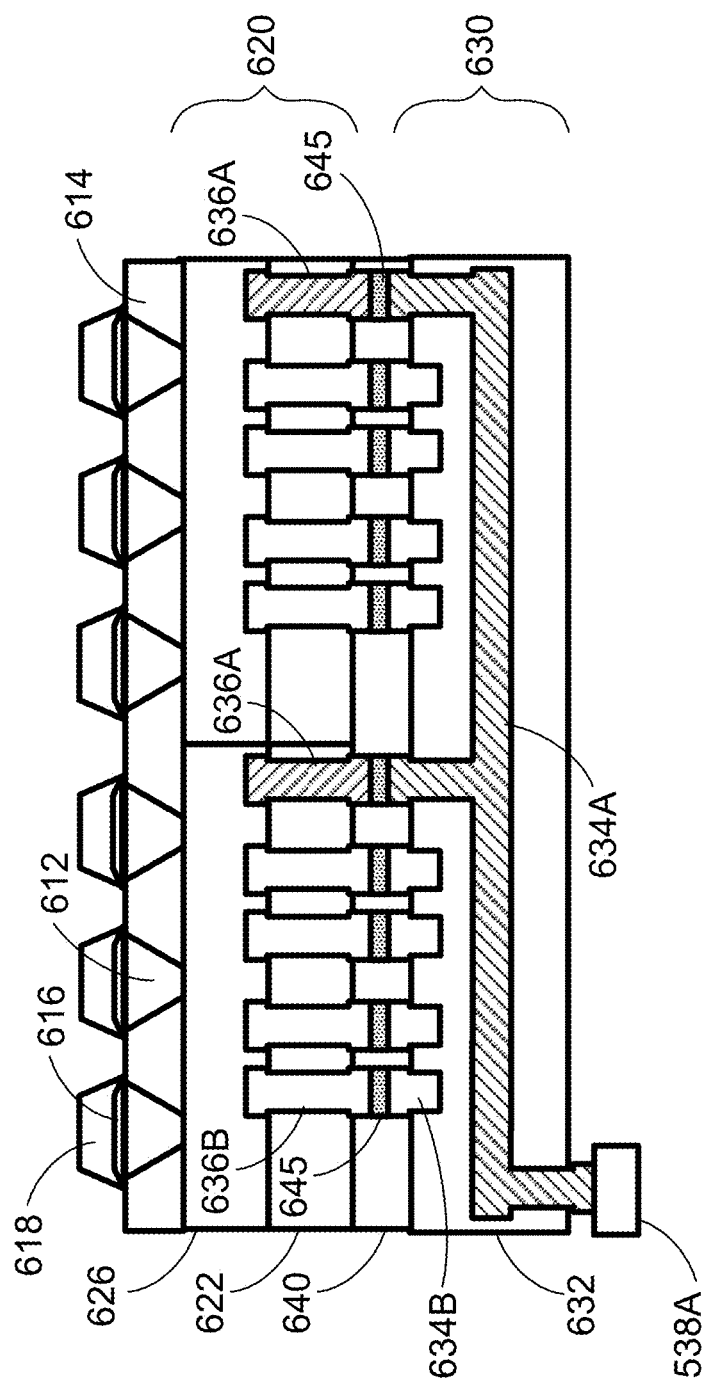
FIG. 6 schematically shows an assembled cross-sectional view of the tiled LED display panel according to one embodiment of the present disclosure.

As discussed above, the LEDs of the tiled LED display panel may be OLEDs. FIG. 6 schematically shows an assembled cross-sectional view of the tiled LED display panel according to one embodiment of the present disclosure, where OLEDs are used in the sub-pixels. Specifically, as shown in FIG. 6, each sub-pixel includes an OLED 612 disposed on the TFT circuits 626, and a pixel defining layer (PDL) 614 is provided to surround the OLED 612. Further, a thin-film encapsulation (TFE) layer 618 is provided to cover the cathode 616 of each OLED 612. Specifically, on each of the flexible back plates 622, the TFE layer 618 is divided into multiple regions, and the TFE layer 618 in each region covers a corresponding OLED 612. In certain embodiments, the TFE layer 618 in each region may covers at least one of the OLEDs 612. Other components of the tiled LED display panel 600, including the flexible back plates 622, the TFT circuits 626, the data lines 634A, the scan lines 634B, the conductive structures 636A and 636B, the data IC 638A, the adhesive layer 640 and the connection structures 645, are all similar to the corresponding components of the tiled LED display panel 500 as shown in FIG. 5A, including the LEDs 510, the flexible back plates 522, the TFT circuits 526, the data lines 534A, the scan lines 534B, the conductive structures 536A and 536B, the data IC 538A, the adhesive layer 540 and the connection structures 545. Thus, details of these similar components are not further elaborated herein.

In certain embodiments, the size and shape of the conductive structures and the corresponding through holes may vary. For example, FIGS. 7A-7E schematically show a conductive structure according to certain embodiments of the present disclosure. As shown in FIGS. 7A and 7C, on the flexible back plate 710, the TFT circuits 712 are located around the through hole 714 on the first side S1 (i.e., the top side) of the flexible back plate 710, forming a ring-shaped structure surrounding the through hole 714. In other words, the through hole 714 is located at the center of the ring-shaped structure of the TFT circuits 712. The width of the TFT circuits 712 is W1. As shown in FIGS. 7B and 7C, on the PCB 720, the signal line 722 is provided with a solder 724 on top thereof. The width of the signal line 722 is W2, which is greater than W1. When the flexible back plate 710 and the PCB 720 are assembled, as shown in FIG. 7D, an optical camera, such as a charge-coupled device (CCD) 750, is provided on top of the through hole 714 to perform alignment of the solder 724 within the through hole 714. Once the components are properly aligned, the solder 724 may be heated to perform soldering, such that the heated solder 724' melts and "climbs" upward to cover the inner wall surface of the through hole 714 as well as the TFT circuits 712 surrounding the through hole 714, thus forming the conductive structure. The design as shown in FIGS. 7A-7C may allow the assembly of the flexible back plate 710 and the PCB to be performed more accurately. Specifically, when multiple flexible back plates 710 are provided, the alignment accuracy may be shown by the deviation of orientations of all flexible back plates 710, where the orientation of a flexible back plate 710 refers to the direction of the sub scan lines or the sub data lines on the flexible back plate 710. In certain embodiments, the deviations of orientations of all subpanels can be less than 5 degrees. The distance between a last pixel of one flexible back plate 710 and the first pixel of the next neighboring flexible back plate 710 in one row or in one column will be L. In one embodiment, 0.95P<L<1.05P, where P is the pitch of pixels in the flexible back plate 710.

Figure 8C:
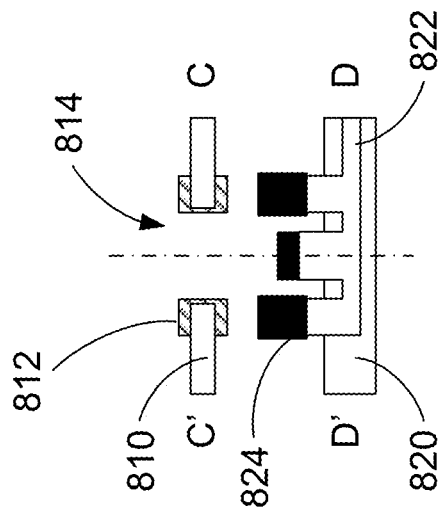
FIG. 8C schematically shows a side cross-sectional view of the flexible back plate as shown in FIG. 8A and the PCB as shown in FIG. 8B along the C-C' and D-D' directions.
Figure 8D:
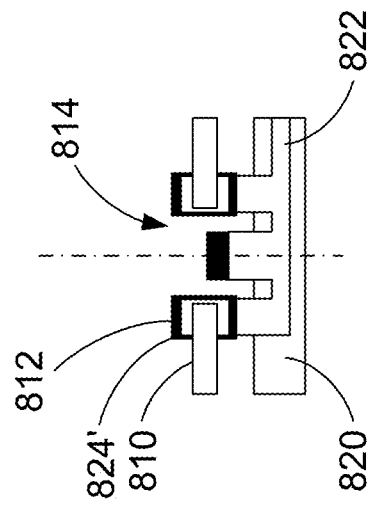
FIG. 8D schematically shows the structure of FIG. 8C after heating according to certain embodiments of the present disclosure.
Figure 8A:
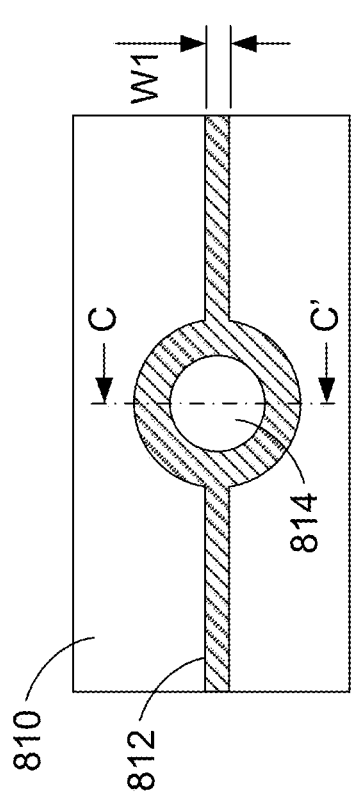
FIG. 8A schematically shows a partial top view of the flexible back plate around a through hole according to certain embodiments of the present disclosure.
Figure 8B:
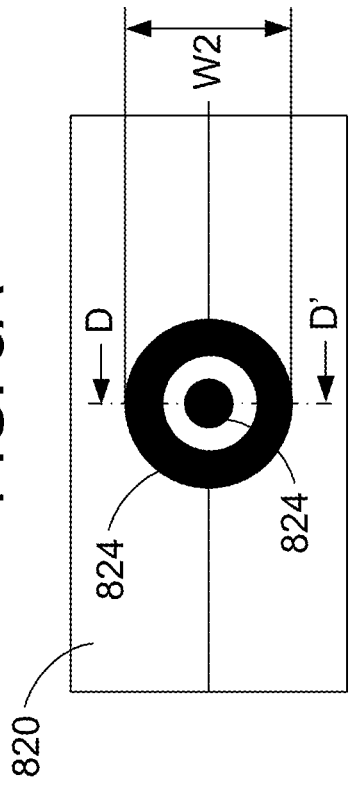
FIG. 8B schematically shows a partial top view of the PCB around a conductive structure according to certain embodiments of the present disclosure.

FIGS. 8A-8G schematically show a conductive structure according to certain embodiments of the present disclosure. As shown in FIG. 8A, on the flexible back plate 810, the TFT circuits 812 are located around the through hole 814 on the first side S1 (i.e., the top side) of the flexible back plate 810, which is similar to the structure as shown in FIG. 7A. As shown in FIGS. 8B and 8C, on the PCB 820, the signal line 822 is provided with multiple solders 824 on top thereof. Specifically, as shown in FIG. 8C, the TFT circuits 812 not only surrounds the through hole 814 but also covers the inner wall surface of the through hole to extend to the second side S2 (i.e., the bottom side) of the flexible back plate 810. Correspondingly, the solders 824 include a middle portion corresponding to the through hole 814, and an outer portion located at the outer side surrounding the middle portion and corresponding to the TFT circuits 812 surrounding the through hole 814. An optical camera, such as a CCD (not shown), may be provided on top of the through hole 814 to perform alignment of the solders 824 within the through hole 814. Once the components are properly aligned, the solders 824 may be heated to perform soldering, such that the outer portion of the heated solders 824' melts and "climbs" upward to cover the inner wall surface of the through hole 814 as well as the TFT circuits 812 surrounding the through hole 814, thus forming the conductive structure.

FIGS. 8E-8G schematically show steps of forming the through hole on the flexible back plate as shown in FIG. 8C according to certain embodiments of the present disclosure. As shown in FIG. 8E, the through hole 814 may be formed on the flexible back plate 810 by drilling, such as laser drilling 860. Once the through hole 814 is formed, as shown in FIG. 8F, the TFT circuits 812 may be formed on both the inner wall surface of the through hole 814 and the top and bottom sides of the flexible back plate 810 by plating. Then, as shown in FIG. 8G, the TFT circuits 812 may be patterned to form the desired shape as shown in FIG. 8A.

Figure 9C:
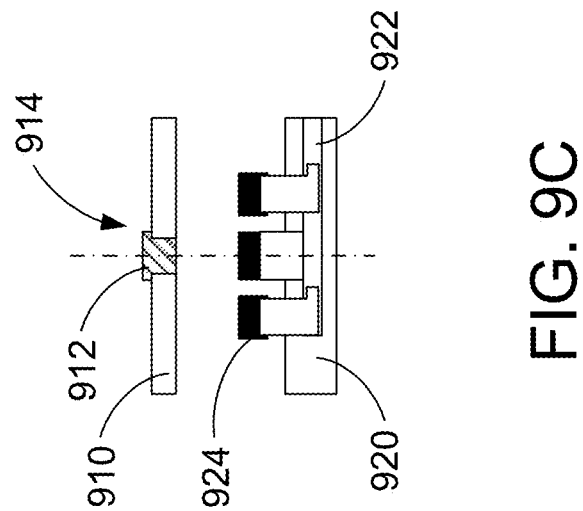
FIG. 9C schematically shows a side cross-sectional view of the flexible back plate as shown in FIG. 9A and the PCB as shown in FIG. 9B along the E-E' and F-F' directions.
Figure 9A:
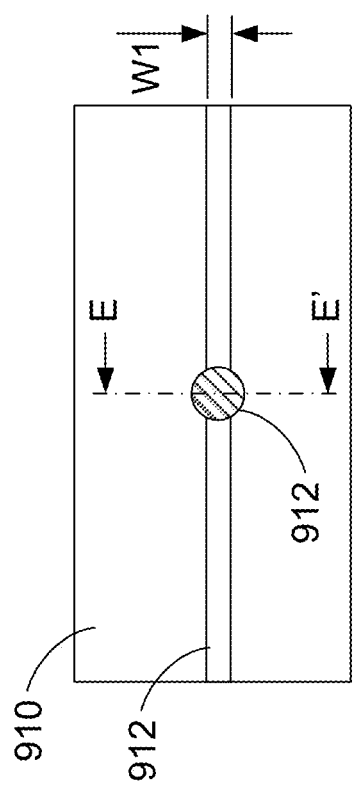
FIG. 9A schematically shows a partial top view of the flexible back plate around a through hole according to certain embodiments of the present disclosure.
Figure 9B:
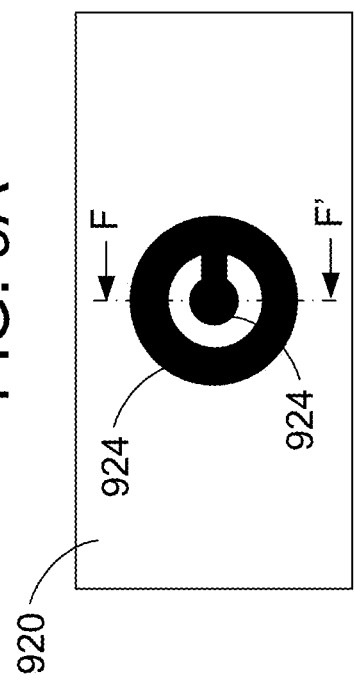
FIG. 9B schematically shows a partial top view of the PCB around a conductive structure according to certain embodiments of the present disclosure.

FIGS. 9A-9F schematically show a conductive structure according to certain embodiments of the present disclosure. As shown in FIGS. 9A and 9C, on the flexible back plate 910, the TFT circuits 912 are located to fill in the through hole 914 (see FIG. 9C). In this case, the size of the through hole 914 may be smaller than the size of the through hole 814 as shown in FIGS. 8A and 8C. As shown in FIGS. 9B and 9C, on the PCB 920, the signal line 922 is provided with a solder 924 in certain pattern on top thereof. Specifically, as shown in FIG. 9C, the TFT circuits 912 not only surrounds the through hole 914 but also fills in the through hole 914. Correspondingly, the solder 924 include a middle portion corresponding to the TFT circuits 912 filled in the through hole 914, and an outer portion located at the outer side surrounding the middle portion. An optical camera, such as a CCD (not shown), may be provided on top of the through hole 914 to perform alignment of the solder 924 within the through hole 914. Once the components are properly aligned, the solder 924 may be heated to perform soldering, such that the middle portion of the heated solders 924 is electrically connected to the TFT circuits 912 filled in the through hole 814, thus forming the conductive structure.

FIGS. 9D-9F schematically show steps of forming the through hole on the flexible back plate as shown in FIG. 9C according to certain embodiments of the present disclosure. As shown in FIG. 9D, the through hole 914 may be formed on the flexible back plate 910 by drilling, such as laser drilling 8960. Once the through hole 914 is formed, as shown in FIG. 9E, the TFT circuits 912 may be formed both in the through hole 914 and on the top and bottom sides of the flexible back plate 910 by plating. Then, as shown in FIG. 9F, the TFT circuits 912 may be patterned to form the desired shape as shown in FIGS. 9A and 9C.

In the embodiments as described above, the holes formed on the flexible back plates are all through holes. In certain embodiment, one or more of the through holes may be replaced by a blinded hole, which does not run through the flexible back plate. For example, FIG. 10 schematically shows a side cross-sectional view of a flexible back plate having a blinded hole according to certain embodiments of the present disclosure. As shown in FIG. 10, instead of forming a through hole, a blinded hole 1014 is formed on the flexible back plate 1010, and the TFT circuits 912 is filled in the through hole 1014. Thus, the flexible back plate 1010 may replace the flexible back plate 910 as shown in FIG. 9A to be assembled with the PCB 920 as shown in FIG. 9B correspondingly.

In the embodiments as described above, the signal lines on the PCB have relatively lower resistances and capacitances. Thus, a voltage pulse transmitted from the edge of signal introduction to the other edge of the end of signal will not degrade by more than 5% of the amplitude of the voltage pulse. Further, the through holes formed on the flexible back plates may be aligned with the corresponding conductive structures (i.e., the solders) on the signal lines on the PCB, which can be fabricated by photolithography. Thus, the flexible back plates and the signal lines on the PCB can be well aligned with each other. In certain embodiments, the deviations of orientations of all of the flexible back plates to the corresponding signal lines on the PCB can be less than 5 degree. Meanwhile, the distance between a last pixel of one flexible back plate and the first pixel of the next neighboring flexible back plate in one row or column can be L, where $0.95P<L<1.05P$, and P is the pitch of pixels in the flexible back plates.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A tiled light emitting diode (LED) display panel, comprising:
    a plurality of flexible back plates arranged in tiles, wherein each of the flexible back plates has a first side and a second side opposite to each other, and has a plurality of through holes formed thereon;
    a pixel array formed by a plurality of LEDs on the flexible back plates, collectively defining a plurality of pixels, wherein each of the pixels comprises one of the LEDs and thin-film transistor (TFT) circuits disposed on the first side of a corresponding one of the flexible back plates;
    a printed circuit board (PCB) disposed at the second side of the flexible back plates, wherein the PCB has a third side and a fourth side opposite to each other, and the third side of the PCB faces the second side of the flexible back plates;
    a plurality of signal lines formed on the third side of the PCB;
    a plurality of sub signal lines formed on the flexible back plates, correspondingly electrically connected to the LEDs and the TFT circuits of the pixels; and
    a plurality of conductive structures formed in the through holes, wherein the sub signal lines are electrically connected to the corresponding signal lines via the conductive structures,
    wherein a resistance per unit length of each of the sub signal lines formed on each of the flexible back plates is greater than a resistance per unit length of the PCB and the signal lines formed thereon.

2. The tiled LED display panel of claim 1, wherein a thickness and a width of each of the signal lines are greater than a thickness and a width of each of the sub signal lines.

3. The tiled LED display panel of claim 1, wherein:
    the signal lines comprise a plurality of data lines extending along a first direction, a plurality of scan lines extending along a second direction, and a plurality of power lines; and
    the sub signal lines comprise a plurality of sub data lines extending along the first direction, a plurality of sub scan lines extending along the second direction, and a plurality of sub power lines, each of the sub data lines is electrically connected to a corresponding one of the data lines, each of the sub scan lines is electrically connected to a corresponding one of the scan lines, and each of the sub power lines is electrically connected to a corresponding one of the power lines.

4. The tiled LED display panel of claim 3, wherein the through holes are aligned in a direction different from the first direction and the second direction.

5. The tiled LED display panel of claim 1, wherein each of the through holes has a diameter greater than 10 um.

6. The tiled LED display panel of claim 1, wherein the conductive structures are electrically connected to the corresponding signal lines through soldering or by anisotropic conductive films (ACFs).

7. The tiled LED display panel of claim 1, wherein the through holes are formed at a border area of the flexible back plates.

8. The tiled LED display panel of claim 1, wherein the through holes are formed in an active area of the flexible back plates.

9. The tiled LED display panel of claim 1, wherein the LEDs are organic LEDs (OLEDs), and each of the flexible back plates is further provided with a thin-film encapsulation (TFE) layer divided in at least two regions to cover the OLEDs, and the TFE layer in each of the at least two regions covers at least one of the OLEDs on each of the flexible back plates.

10. The tiled LED display panel of claim 1, further comprising at least one signal integrated circuit (IC) disposed on the PCB, configured to provide signals to the signal lines correspondingly.

11. The tiled LED display panel of claim 10, wherein the at least one signal IC are disposed at a border area on the third side of the PCB.

12. The tiled LED display panel of claim 10, wherein the at least one signal IC are disposed on the fourth side of the PCB.

13. The tiled LED display panel of claim 1, wherein for a respective through hole of the through holes, one of the TFT circuits corresponding to the respective through hole and a respective conductive structure of the conductive structures corresponding to the respective through hole is formed with a hole corresponding to the respective through hole.

14. The tiled LED display panel of claim 13, wherein for the respective through hole of the through holes, the TFT circuits corresponding to the respective through hole has a surrounding portion surrounding the hole and the respective through hole, and the respective conductive structure is formed by a solder material attached to a side wall of the through hole and connected to the surrounding portion.

15. The tiled LED display panel of claim 13, wherein for the respective through hole of the through holes, the TFT circuits corresponding to the respective through hole has a surrounding portion surrounding the hole and the respective through hole and attached to a side wall of the through hole, and the respective conductive structure is formed by a solder material attached to the side wall of the through hole and connected to the surrounding portion.

16. The tiled LED display panel of claim 13, wherein for the respective through hole of the through holes, the TFT circuits corresponding to the respective through hole has a filler portion filled in a part of the respective through hole, and the respective conductive structure is formed by a solder material having the hole and connected to the filler portion.

17. A light emitting diode (LED) display panel, comprising:
a flexible back plate having a first side and a second side opposite to each other, and a plurality of through holes formed thereon;
a pixel array formed by a plurality of LEDs on the flexible back plate, collectively defining a plurality of pixels, wherein each of the pixels comprises one of the LEDs and thin-film transistor (TFT) circuits disposed on the first side of the flexible back plate;
a printed circuit board (PCB) disposed at the second side of the flexible back plate, wherein the PCB has a third side and a fourth side opposite to each other, and the third side of the PCB faces the second side of the flexible back plate;
a plurality of signal lines formed on the third side of the PCB;
a plurality of sub signal lines formed on the flexible back plates, correspondingly electrically connected to the LEDs and the TFT circuits of the pixels; and
a plurality of conductive structures formed in the through holes, wherein the sub signal lines are electrically connected to the corresponding signal lines via the conductive structures, wherein for a respective through hole of the through holes, one of the TFT circuits corresponding to the respective through hole and a respective conductive structure of the conductive structures corresponding to the respective through hole is formed with a hole corresponding to the respective through hole.

18. The LED display panel of claim 17, wherein a resistance per unit length of the sub signal lines formed on the flexible back plate is greater than a resistance per unit length of the PCB and the signal lines formed thereon.

19. The LED display panel of claim 17, wherein:
the signal lines comprise a plurality of data lines extending along a first direction, a plurality of scan lines extending along a second direction, and a plurality of power lines; and
the sub signal lines comprise a plurality of sub data lines extending along the first direction, a plurality of sub scan lines extending along the second direction, and a plurality of sub power lines, each of the sub data lines is electrically connected to a corresponding one of the data lines, each of the sub scan lines is electrically connected to a corresponding one of the scan lines, and each of the sub power lines is electrically connected to a corresponding one of the power lines.

20. The LED display panel of claim 17, wherein a thickness and a width of each of the signal lines are greater than a thickness and a width of each of the sub signal lines.

* * * * *